(12) United States Patent
Uemoto

(10) Patent No.: US 7,683,981 B2
(45) Date of Patent: Mar. 23, 2010

(54) LIGHT EMITTING DIODE SUBSTRATE, METHOD OF MANUFACTURING THE SAME, AND LIQUID CRYSTAL DISPLAY DEVICE USING THE SAME

(75) Inventor: Tsutomu Uemoto, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 429 days.

(21) Appl. No.: 11/709,391

(22) Filed: Feb. 21, 2007

(65) Prior Publication Data
US 2007/0195044 A1    Aug. 23, 2007

(30) Foreign Application Priority Data
Feb. 23, 2006    (KR) ...................... 10-2006-0017527

(51) Int. Cl.
*G02F 1/1333*    (2006.01)
*F21V 7/04*    (2006.01)
(52) U.S. Cl. ..................... 349/69; 362/612; 362/613
(58) Field of Classification Search ................ 349/60, 349/69; 362/612–613
See application file for complete search history.

(56) References Cited

U.S. PATENT DOCUMENTS 6,738,031 B2 * 5/2004 Young et al. ................... 345/55
7,460,103 B2 * 12/2008 Konno et al. ................ 345/102

\* cited by examiner

*Primary Examiner*—Jerry T Rahll
(74) *Attorney, Agent, or Firm*—Innovation Counsel LLP

(57) ABSTRACT

A luminance control circuit for controlling the luminance levels of different colored light sources that lends itself to easy incorporation into display devices is presented. A light emitting diode (LED) substrate includes a plurality of driving thin film transistors (TFTs) including a semiconductor layer deposited on a substrate. A plurality of LEDs for generating lights of different wavelengths is mounted respectively on the plurality of driving TFTs. A plurality of thin film sensors for sensing the luminous intensities of the plurality of LEDs is formed between the plurality of LEDs and the substrate. A luminance control circuit for controlling the driving TFTs has of a plurality of controlling TFTs including a semiconductor layer deposited on the substrate and is connected to the plurality of thin film sensors.

21 Claims, 4 Drawing Sheets

LIGHT EMITTING DIODE SUBSTRATE, METHOD OF MANUFACTURING THE SAME, AND LIQUID CRYSTAL DISPLAY DEVICE USING THE SAME

CROSS-REFERENCE TO RELATED APPLICATION(S)

This application claims priority from Korean Patent Application No. 2006-0017527 filed in the Korean Patent Office on Feb. 23, 2006, the entire content of which is incorporated by reference herein.

BACKGROUND OF THE INVENTION

1. Field of the Invention

The present invention relates to a light emitting diode device, and more particularly to a light emitting diode substrate with thin film light sensors integrated on the substrate.

2. Description of the Related Art

A liquid crystal display (LCD) device displays an image by using electro-optical properties of liquid crystals. Specifically, the LCD device includes an LCD panel for displaying an image through a pixel matrix and a driving circuit for driving the LCD panel. Since the LCD panel is a non-light-emitting device, the LCD device includes a backlight unit for supplying light to the LCD panel.

The backlight unit typically uses a lamp as a light source but recently, the trend has been shifting to using a light emitting diode (LED) having high luminance as a point light source. Since the point light source uses red (R), green (G) and blue (B) LEDs of three primary colors, a wide variety of colors can be produced by mixing the primary colors.

However, color uniformity is less than what is desirable when using the primary color LEDs. The reason for the low color uniformity is that the different-colored point light sources differ in luminous efficiency and aging characteristics. In order to prevent the color uniformity from decreasing, a luminance control circuit for controlling the luminance of the R, G and B LEDs or optical sensors for measuring luminous intensities is included in an LED driver. These additional components complicate the circuit configuration and raises manufacturing cost.

SUMMARY OF THE INVENTION

The present invention provides an LED substrate that reduces manufacturing cost and improves color uniformity, a method of manufacturing the same and an LCD device using the same. A thin film light sensor is integrated on the substrate, together with an LED driving circuit.

In one aspect, the present invention is provided an LED substrate including a plurality of driving TFTs including a semiconductor layer deposited on a substrate, a plurality of LEDs mounted respectively on the plurality of driving TFTs, for generating lights of different wavelengths, a plurality of thin film sensors formed between the plurality of LEDs and the substrate, for sensing the luminous intensities of the plurality of LEDs, and a luminance control circuit having a plurality of controlling TFTs including a semiconductor layer deposited on the substrate and being connected to the plurality of thin film sensors, thus to control the driving TFTs.

According to another aspect of the present invention, there is provided a method of manufacturing an LED substrate that entails: forming a plurality of driving TFTs including a semiconductor layer on a substrate, mounting a plurality of LEDs generating lights of different wavelengths on the plurality of driving TFTs, forming a plurality of thin film sensors sensing the luminous intensities of the plurality of LEDs between the plurality of LEDs and the substrate, and forming a luminance control circuit that has a plurality of TFTs including a semiconductor layer deposited on the substrate and is connected to the plurality of thin film sensors and the plurality of driving TFTs.

According to still another aspect of the present invention, there is provided an LCD device comprising a light source including the above-described LED substrate, and an LCD panel for displaying an image by using light generated from the light source.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE EMBODIMENTS

The exemplary embodiments of the present invention will now be described with reference to FIGS. 1 to 4.

Figure 1:
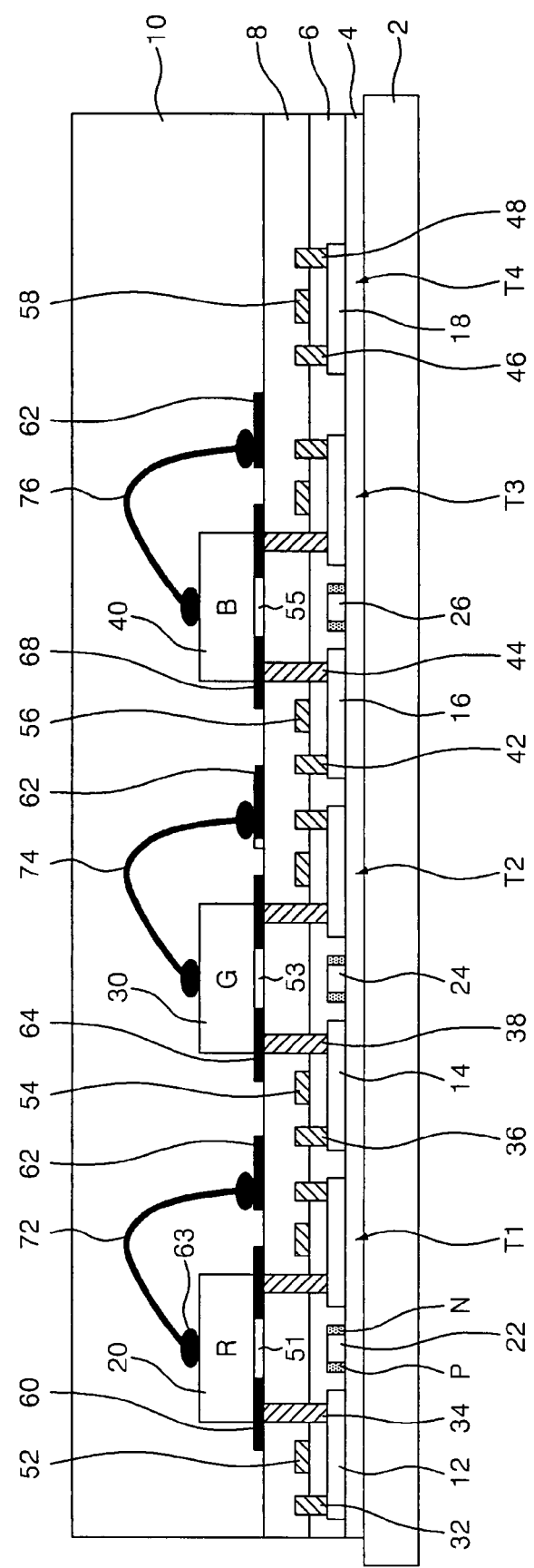
FIG. 1 is a cross-sectional view of an LED substrate according to an exemplary embodiment of the present invention.

FIG. 1 is a cross-sectional view illustrating a part of an LED substrate according to an exemplary embodiment of the present invention.

The LED substrate illustrated in FIG. 1 includes first to third thin film transistors (TFTs) T1, T2 and T3 for respectively driving R, G and B LEDs 20, 30 and 40, first to third thin film sensors 22, 24 and 26 for respectively detecting the luminous intensities of the R, G and B LEDs 20, 30 and 40, and a fourth TFT T4 contained in a luminance control circuit for controlling the first to third TFTs T1, T2 and T3. The first to fourth TFTs T1 to T4 and the first to third thin film sensors 22, 24 and 26 may use any one of polysilicon, polysilicon-germanium, amorphous silicon, and amorphous silicon-germanium thin films. However, for simplicity of explanation, the description will focus on the polysilicon thin film by way of example.

The first to third TFTs T1, T2 and T3 for respectively driving the R, G and B LEDs 20, 30 and 40, and the fourth TFT T4 of the luminance control circuit include semiconductor layers 12, 14, 16 and 18 using the polysilicon thin film. Specifically, the first to fourth TFTs T1 to T4 include the semiconductor layers 12, 14, 16 and 18 formed on a substrate 2 with a buffer layer 4 interposed therebetween, gate electrodes 52, 54, 56 and 58 overlapping the semiconductor layers 12, 14, 16 and 18 with a first insulating layer 6 interposed therebetween, source electrodes 34, 38, 44 and 48 connected to source regions of the semiconductor layers 12, 14, 16 and 18, and drain electrodes 32, 36, 42 and 46 connected to drain regions of the semiconductor layers 12, 14, 16 and 18. The source and drain regions of the semiconductor layers 12, 14, 16 and 18 are doped with n-type or p-type impurities and are thus electrically conductive. The source electrodes 34, 38, 44 and 48 are connected to the source regions of the semiconductor layers 12, 14, 16 and 18 by penetrating at least one insulating layer 6, and similarly, the drain electrodes 32, 36, 42 and 46 are connected to the drain regions of the semiconductor layers 12, 14, 16 and 18 by penetrating at least one insulating layer 6. The source electrodes 34, 38 and 44 of the first to third TFTs T1 to T3 penetrate a second insulating layer 8 and are extended to be connected to anodes 60, 64 and 68 of the R, G and B LEDs 20, 30 and 40, respectively.

The gate electrodes 52, 54 and 56 of the first to third TFTs T1, T2 and T3 are connected to the luminance control circuit including the fourth TFT T4 and receive a luminance control signal from the luminance control circuit. The drain electrodes 32, 36 and 42 of the first to third TFTs T1, T2 and T3 are connected to a driving voltage (VDD) supply line (not shown) from a power source, and the source electrodes 34, 38 and 44 thereof are connected to the anodes 60, 64 and 68 of the R, G and B LEDs 20, 30 and 40 to supply an LED driving signal. Such first to third TFTs T1, T2 and T3 control the amount of current supplied to the R, G and B LEDs 20, 30 and 40 from the VDD supply line according to the control signal of the luminance control circuit, thereby driving the R, G and B LEDs 20, 30 and 40. The luminance control circuit consists of a plurality of switching TFTs (as will be described below in reference to FIG. 2) such as the fourth TFT T4 and controls the first to third TFTs T1, T2 and T3.

The R, G and B LEDs 20, 30 and 40 are formed in a chip type configuration using semiconductor crystal, and have anodes 60, 64 and 68 formed at their lower surfaces and cathodes 63, 65 and 67 formed at their upper surfaces. The R, G and B LEDs 20, 30 and 40 are mounted on the second insulating layer 8 so that their anodes 60, 64 and 68 are respectively connected to the source electrodes 34, 38 and 44 of the first to third TFTs T1, T2 and T3. The anodes 60, 64 and 68 of the R, G and B LEDs 20, 30 and 40 are respectively connected to the source electrodes 34, 38 and 44 of the first to third TFTs T1, T2 and T3 through a conductive adhesive, for example, an anisotropic conductive film (ACF). The cathodes 63, 65 and 67 formed at the upper surfaces of the R, G and B LEDs 20, 30 and 40 are respectively connected to bonding wires 72, 74 and 76 and to a ground electrode 62 formed on the second insulating layer 8. The R, G and B LEDs 20, 30 and 40 emit lights in response to the amount of current supplied through the first to third TFTs T1, T2 and T3, thus to generate R, G and B colored lights each having luminance proportional to the received current. An organic insulating layer 10 covering the R, G and B LEDs 20, 30 and 40 is coated on the second insulating layer 8 on which the R, G and B LEDs 20, 30 and 40 are mounted. The organic insulating layer 10 is formed in a convex (or concave) lens shape and therefore can improve the luminous efficiencies of the R, G and B LEDs 20, 30 and 40.

The first to third thin film sensors 22, 24 and 26 for sensing the luminous intensities of the R, G and B LEDs 20, 30 and 40 are formed of a polysilicon thin film under the R, G and B LEDs 20, 30 and 40, together with the semiconductor layers 12, 14, 16 and 18 of the first to fourth TFTs T1, T2, T3 and T4. Each of the first to third thin film sensors 22, 24 and 26 is formed as a photodiode type of a p-i-n structure in which p-type and n-type impurities are injected into both terminals of an intrinsic semiconductor using polysilicon. Regions of the first to third thin film sensors 22, 24 and 26 into which the p-type impurities are injected are connected to the ground electrode 62 formed on the second insulating layer 8 through a contact electrode (not shown) penetrating the first and second insulating layers 6 and 8, and regions into which the n-type impurities are injected has a floated structure. In addition, the regions of the first to third thin film sensors 22, 24 and 26 into which the p-type impurities are injected are also connected to the luminance control circuit including the fourth TFT T4 through another contact electrode (not shown). These first to third thin film sensors 22, 24 and 26 sense the luminous intensities of the R, G and B LEDs 20, 30 and 40 through through-holes 51, 53 and 55 penetrating the anodes 60, 64 and 68 of the R, G and B LEDs 20, 30, 40, generate sensing signals proportional to the luminous intensities, and supply the sensing signals to the luminance control circuit.

The luminance control circuit including the fourth TFT T4 controls the first to third TFTs T1, T2 and T3 by using a luminance control signal received from an external component and luminous intensity sensing signals from the first to third thin film sensors 22, 24 and 26. Therefore, a luminous intensity ratio becomes constant regardless of an aging characteristic of each of the R, G and B LEDs 20, 30, 40 and color uniformity is improved.

Each of the R, G and B LEDs 20, 30 and 40 is formed of a chip in a polygonal shape and the anodes 60, 64 and 68 of their lower surfaces are formed in a polygonal band or circular band shape having the through-holes 51, 53 and 55 at the center aligned with each of the first to third thin film sensors 22, 24 and 26. The semiconductor layers 12, 14 and 16 of the first to third TFTs T1, T2 and T3, the gate electrodes 52, 54 and 56, the source electrodes 34, 38 and 44, and the drain electrodes 32, 36 and 42 may also be formed in a polygonal band or circular band shape encompassing the peripheral parts of the first to third thin film sensors 22, 24 and 26 based on each of the first to third thin film sensors 22, 24 and 26.

A method of manufacturing the LED substrate having the above-described configuration will now be described.

The buffer layer 4 is formed on the substrate 2, and the semiconductor layers 12, 14, 16 and 18 of the first to fourth TFTs T1 to T4, and the first to third thin film sensors 22, 24 and 26 are formed on the buffer layer 4 by using a polysilicon thin film. The substrate 2 may be made of an insulating substrate, such as quartz, glass, ceramic, an organic film, or a metal substrate, such as stainless steel and tungsten. The buffer layer 4 is formed by depositing an inorganic insulating material, such as oxide silicon, on the substrate 2 by a deposition method such as plasma enhanced chemical vapor deposition (PECVD). The semiconductor layers 12, 14, 16 and 18 and the first to third thin film sensors 22, 24 and 26 are formed by forming an amorphous silicon thin film on the buffer layer 4 by PECVD, crystallizing the amorphous silicon thin film by laser annealing to form a polysilicon thin film, and patterning the polysilicon thin film by a mask process. Thereafter, n-type or p-type impurities are injected into both terminals of each of the semiconductor layers 12, 14, 16 and 18 of the first to fourth TFTs T1 to T4 to form the source regions and drain regions by another mask process, and n-type and p-type impurities are injected into both terminals of each of the first to third thin film sensors 22, 24 and 26 to form anodes and cathodes. In this case, the n-type and p-type impurities are injected by different mask processes.

Next, at least two insulating layers 6 and 8, the gate electrodes 52, 54, 56 and 58, the source electrodes 34, 38, 44 and 48, the drain electrodes 32, 36, 42 and 46 of the first to fourth TFTs T1 to T4, and the ground electrode 62 are formed by a plurality of mask processes on the buffer layer 4 on which the semiconductor layers 12, 14, 16 and 18, and the first to third thin film sensors 22, 24 and 26 are formed. The drain electrodes 32, 36, 42 and 46 of the first to fourth TFTs T1 to T4 at least partially penetrate the first insulating layer 6 to be connected to the drain regions of the semiconductor layers 12, 14, 16 and 18, and the source electrodes 34, 38 and 44 of the first to third TFTs T1 to T3 penetrate the first and second insulating layers 6 and 8 to be connected to the source regions of the semiconductor layers 12, 14 and 16. The source electrode 48 of the fourth TFT T4 penetrates the first insulating layer 6 to be connected to the source region of the semiconductor layer 18. For example, the first insulating layer 6 including a contact hole is formed by one mask process and the gate electrodes 52, 54, 56 and 58, the drain electrodes 32, 36, 42 and 46, and the source electrode 48 of the fourth TFT T4 are formed on the first insulating layer 6 by another mask process. Thereafter, the second insulating layer 8 including a contact hole is formed by a further mask process, and the source electrodes 34, 38 and 44 and the ground electrode 62 are formed on the second insulating layer 8 by still another mask process.

Next, the R, G and B LEDs 20, 30 and 40 are respectively mounted on the first to third TFTs T1 to T3. Then the anodes 60, 64 and 68 of the R, G and B LEDs 20, 30 and 40 are connected to the source electrodes 34, 38 and 44 of the first to third TFTs T1 to T3 through a conductive adhesive. The bonding wires 72, 74 and 76 connect the cathodes 63, 65 and 67 of the R, G and B LEDs 20, 30 and 40 to the ground electrode 62 by a bonding process, respectively. Thereafter, the organic insulating layer 10 covering the R, G and B LEDs 20, 30 and 40 is coated on the second insulating layer 8 on which the R, G and B LEDs 20, 30 and 40 are formed. The organic insulating layer 10 is formed in a convex (or concave) lens shape in the unit of the R, G and B LEDs 20, 30 and 40 by a mask process, thereby improving the luminous efficiencies of the R, G and B LEDs 20, 30 and 40.

As described above, the LED substrate according to the present invention integrates, on a single substrate 2, the first to third TFTs T1, T2 and T3 for driving the R, G and B LEDs 20, 30 and 40, the luminance control circuit consisting of a plurality of fourth TFTs T4 for controlling the first to third TFTs T1, T2 and T3, and the first to third thin film sensors 22, 24 and 26 for sensing the luminous intensities of the R, G and B LEDs 20, 30 and 40 by using a polysilicon thin film, and a plurality of conductive layers and insulating layers, thus saving manufacturing cost.

Figure 2:
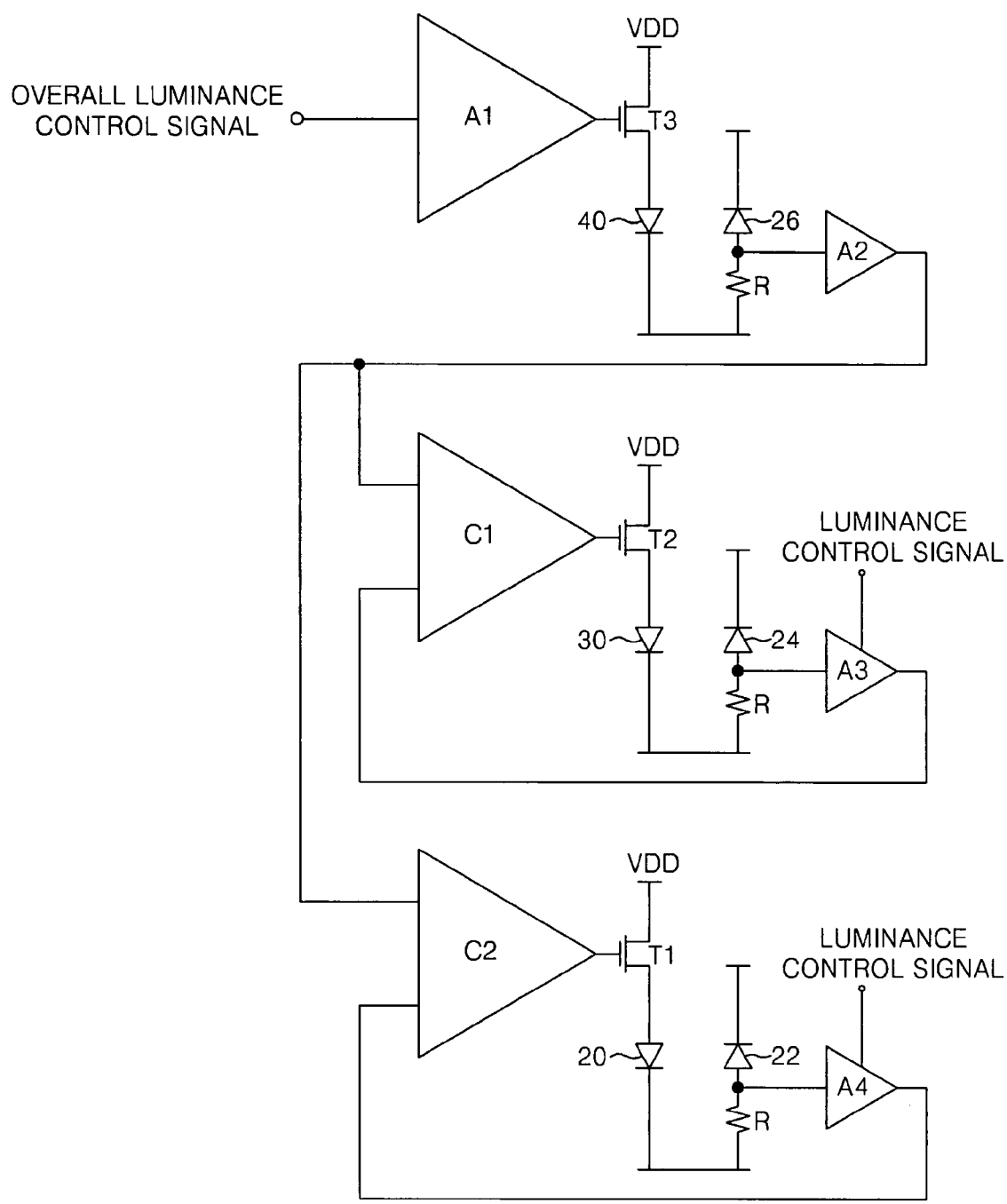
FIG. 2 is an equivalent circuit diagram of the LED substrate shown in FIG. 1.

FIG. 2 is an equivalent circuit diagram of the LED substrate shown in FIG. 1.

Referring to FIG. 2, the LED substrate includes the first to third TFTs T1, T2, and T3 for forming a current path between the VDD supply line and the R, G and B LEDs 20, 30 and 40, the first to third thin film sensors 22, 24 and 26 having cathodes floated and having anodes connected to the ground via current limiting resistors R, for detecting the luminous intensities of the R, G and B LEDs 20, 30 and 40, and the luminance control circuit having a plurality of amplifiers A1 to A4 and comparators C1 and C2 connected between the first to third thin film sensors 22, 24 and 26 and the first to third TFTs T1, T2, and T3.

The luminance control circuit uniformly controls the luminous intensity ratios of G LED 30 and the R LED 20 based on the B LED 40 having the smallest luminous intensity ratio in order to improve color uniformity. The third TFT T3 for driving the B LED 40 is controlled by the first amplifier A1 receiving an overall luminance control signal. The second TFT T2 for driving the G LED 30 controls a G luminous intensity to be substantially the same as a B luminous intensity, by having the first comparator C1 compare a B luminous intensity sensing signal from the third thin film sensor 26 with a G luminous intensity sensing signal from the second thin film sensor 24. The first TFT T1 for driving the R LED 20 controls an R luminous intensity to be substantially the same as the B luminous intensity, by having the second comparator C2 compare the B luminous intensity sensing signal from the third thin film sensor 26 to an R luminous intensity sensing signal from the first thin film sensor 22. The luminance control circuit is comprised of a plurality of TFTs such as the fourth TFT T4 shown in FIG. 1 and is integrated on the substrate 2, together with the first to third TFTs T1 to T3 and the first to third thin film sensors 22, 24 and 26.

Specifically, the third TFT T3 is controlled by the first amplifier A1 receiving the overall luminance control signal from an external component and drives the B LED 40 by controlling the amount of current supplied to the B LED 40 from the VDD supply line. The third thin film sensor 26 generates a luminous intensity sensing signal in proportion to the light quantity of the B LED 40 and supplies the sensing signal to the first comparator C1 through the second amplifier A2. The second TFT T2 is controlled by the first comparator C1 and drives the G LED 30 by controlling the amount of current supplied to the G LED 30 from the VDD supply line. The first comparator C1 compares the B luminous intensity sensing signal supplied from the third thin film sensor 26 through the second amplifier A2 with the G luminous intensity sensing signal supplied from the second thin film sensor 24 through the third amplifier A3 and adjusts the control signal of the second TFT T2 to make the luminous intensity of the G LED 30 to be about equal to that of the B LED 40. The third amplifier A3 may be controlled by a relative luminance control signal from an external component. The first TFT T1 is controlled by the second comparator C2 and drives the R LED 20 by controlling the amount of current supplied to the R LED 20 from the VDD supply line. The second comparator C2 compares the B luminous intensity sensing signal supplied from the third thin film sensor 26 through the second amplifier A2 with the R luminous intensity sensing signal supplied from the first thin film sensor 22 through the fourth amplifier A4 and adjusts the control signal of the first TFT T1 to make the luminous intensity of the R LED 20 about the same as that of the B LED 40. The fourth amplifier A4 may be controlled by a relative luminance control signal from an outside component.

As described above, the thin film sensors 22, 24 and 26 for sensing the luminous intensities of the R, G and B LEDs 20, 30 and 40 and the luminance control circuit are mounted on the LED substrate according to the present invention. With this arrangement, the color uniformity can be improved by keeping the luminous intensity ratio constant without regard to the different luminous efficiencies and aging characteristics of the R, G and B LEDs 20, 30 and 40. The LED substrate is applicable to various appliances using an LED, for example, to an LED display device or a backlight unit of an LCD device. Hereinafter, an example of the backlight unit of the LCD device to which the LED substrate is applied will be explained.

Figure 3:
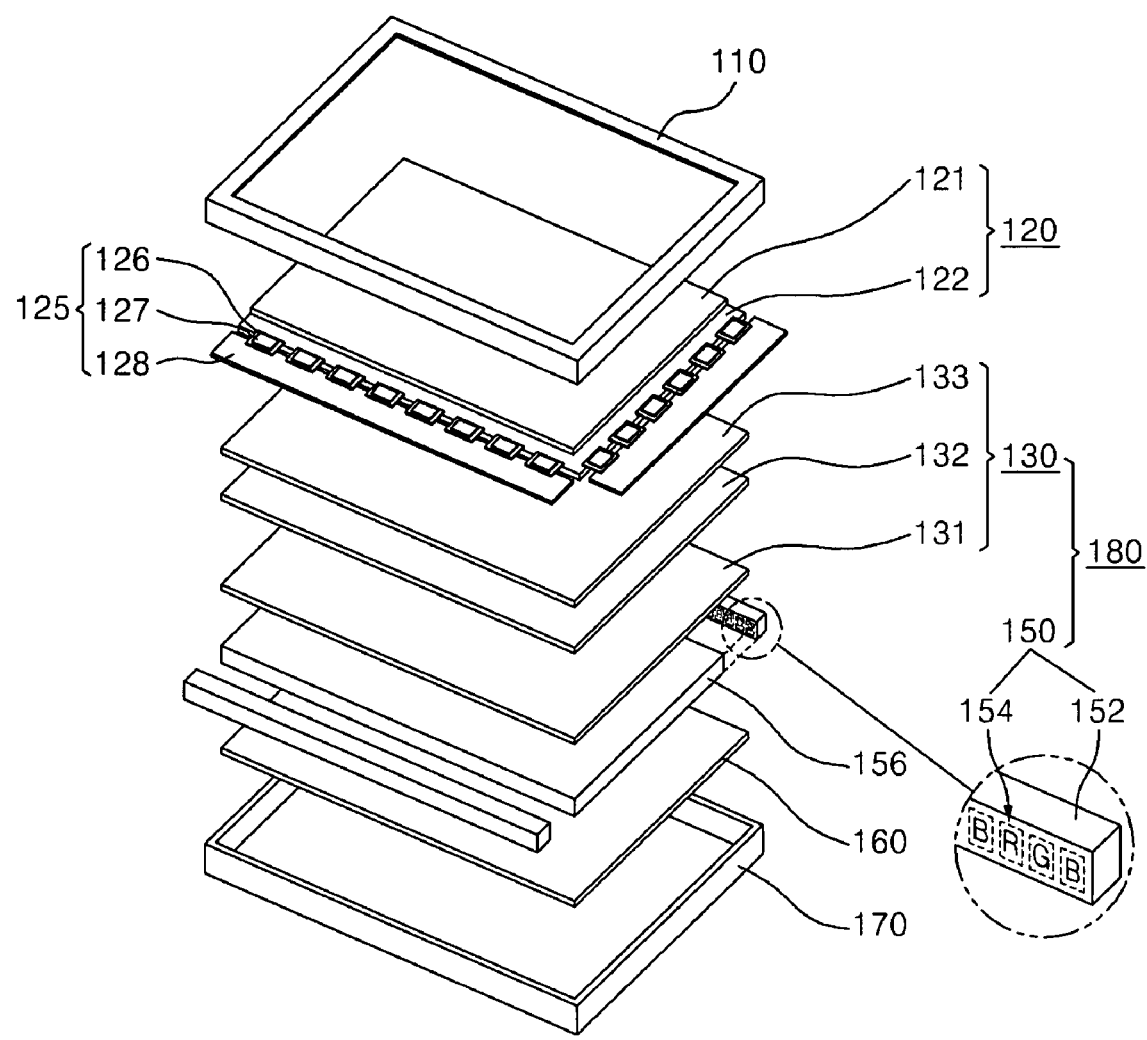
FIG. 3 is an exploded perspective view of an LCD device to which an LED substrate is applied according to an exemplary embodiment of the present invention.

FIG. 3 is an exploded perspective view of an LCD device to which the LED substrate is applied according to an exemplary embodiment of the present invention.

Referring to FIG. 3, the LCD device includes an LCD panel 120 for displaying an image, an edge-type backlight unit 180 for supplying light from the back of the LCD panel 120, and top and bottom chassis 110 and 170 for fixing the LCD panel 120 and the backlight unit 180.

The LCD panel 120 has a structure in which an upper substrate 121 on which color filters are formed is bonded to a lower substrate 122 on which TFTs are formed, with liquid crystal disposed therebetween. The LCD panel 120 includes subpixels that are independently driven by the TFTs and arranged in a matrix format to display an image. Since the LCD panel 120 is a non-light-emitting device, it uses light from the backlight unit 180. A driver 125 is connected to the lower substrate 122 of the LCD panel 120. The driver 125 includes circuit films 126 on which driving chips 127 are mounted, for driving data lines and gate lines formed on the lower substrate 122 of the LCD panel 120. One side of the circuit film 126 is connected to the lower substrate 122, and another side is connected to a printed circuit board (PCB) 128. In FIG. 3, the circuit films 126 supporting the driving chips 127 are illustrated to have a chip-on-film (COF) or tape carrier package (TCP) structure. However, in other embodiments, the driving chips 127 may be directly mounted on the lower substrate 122 by a chip-on-glass (COG) method or may be formed on the lower substrate 122 during a TFT forming process.

The backlight unit 180 includes an edge-type light source 150 arranged separately from a light guide plate 156, and a plurality of optical sheets 130 and a reflective plate 160 arranged at the upper and lower parts of the light guide plate 156 to raise light efficiency.

The edge-type light source 150 generates lights by using R, G and B LEDs 154. The edge-type light source 150 has a structure in which the R, G and B LEDs 154 are mounted on a substrate 152 where a driving circuit for driving the R, G and B LEDs 154, thin film sensors for sensing the luminous intensities of the R, G and B LEDs 154, and a luminance control circuit are integrated. The luminance control circuit controls the driving circuit by using a luminance control signal received from an outside component and luminous intensity sensing signals from the thin film sensors so that the luminous intensities of the R, G and B LEDs 154 can be constant. The edge-type light source 150 generates R, G and B lights having substantially equal luminous intensity ratio by compensating for the different luminous efficiencies and aging characteristics of the R, G and B LED 154. Accordingly, there is no change in color and luminous characteristic is stabilized, thus improving color uniformity.

The light guide plate 156 converts light having an optical distribution of a point light source form generated from the edge-type light source 150 into light having an optical distribution of a surface light source form to move light toward the LCD panel 120. The plurality of optical sheets 130 includes a diffuser sheet 131, a prism sheet 132 and a protector sheet 133. The optical sheets 130 diffuse and collect light traveling toward the LCD panel 120 from the light guide plate 156 to have a uniform light distribution, thus improving the efficiency. The reflective plate 160 reflects light traveling toward the back (corresponding to the bottom in FIG. 3) of the light guide plate 156 toward the LCD panel 120 to improve the light efficiency.

The LCD panel 120 and the backlight unit 180 are fixed in an internal space provided by engaging the bottom chassis 170 and the top chassis 110. A mold frame (not shown) holding the peripheral parts of the LCD panel 120 and the backlight unit 180 may be additionally provided.

Figure 4:
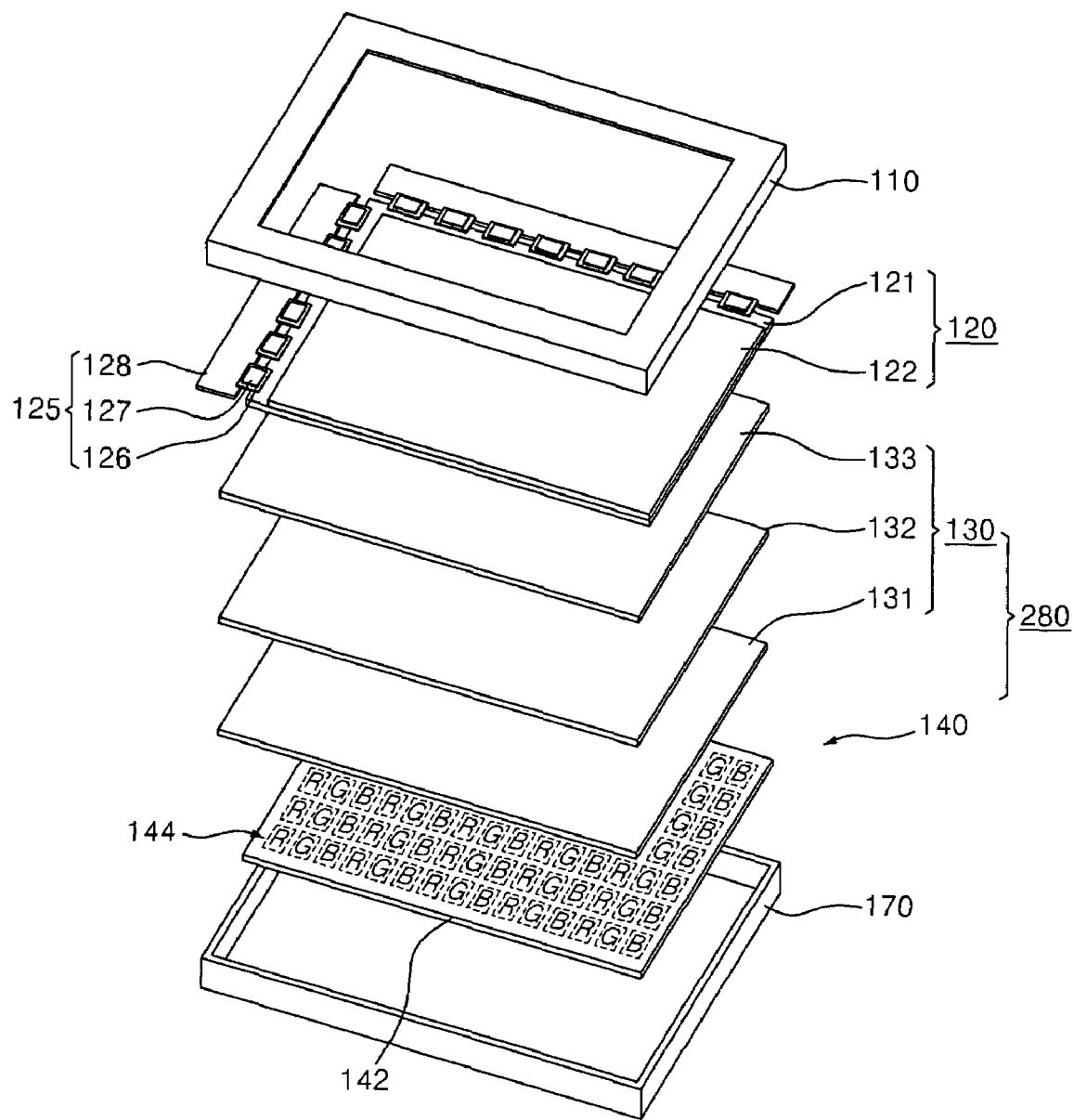
FIG. 4 is an exploded perspective view of an LCD device to which an LED substrate is applied according to another exemplary embodiment of the present invention.

FIG. 4 is an exploded perspective view of a direct-type LCD device using an LED substrate according to another exemplary embodiment of the present invention.

The direct-type LCD device shown in FIG. 4 has substantially the same configuration as the edge-type LCD device shown in FIG. 3 except for a backlight unit 280, and therefore, any repetitive description will be omitted.

The direct-type backlight unit 280 shown in FIG. 4 includes a direct-type light source 140, and the plurality of optical sheets 130 arranged between the direct-type light source 140 and the LCD panel 120. A reflective plate (not shown) is arranged at the back of the direct-type light source 140 or the inner surface of the bottom chassis 170 is coated with a reflective material. The direct-type light source 140 generates lights by using R, G and B LEDs 144 arranged in columns and rows. The direct-type light source 140 has a structure in which the R, G and B LEDs 144 are mounted on a substrate 142 where a driving circuit for driving the R, G and B LEDs 144, thin film sensors for sensing the luminous intensities of the R, G and B LEDs 144 and, a luminance control circuit are integrated. The luminance control circuit controls the driving circuit by using a luminance control signal received from an external component and luminous intensity sensing signals from the thin film sensors so that the luminous intensities of the R, G and B LEDs 144 can be constant. The direct-type light source 140 generates R, G and B lights having a constant intensity ratio by compensating for the different luminous efficiencies and aging characteristics of the R, G and B LED 144. Accordingly, any change in color and luminous characteristic is stabilized, improving color uniformity.

As is apparent from the foregoing description, since the driving circuit for driving the R, G and B LEDs, the sensors for sensing the luminous intensities, and the luminance control circuit are integrated on one substrate, manufacturing cost is reduced and a uniform luminous intensity ratio is obtained irrespective of the different luminous efficiencies and aging characteristics of the R, G and B LEDs. Therefore, color uniformity can be improved.

The LED substrate according to the present invention is applicable to various appliances using an LED, and may be used in the backlight unit of the LCD device to enhance picture quality and improve color uniformity.

While the invention has been shown and described with reference to certain preferred embodiments, it will be understood by those skilled in the art that various changes in form and detail may be made therein without departing from the spirit and scope of the invention as defined by the appended claims.

What is claimed is:

1. A light emitting diode substrate, comprising:
a plurality of driving thin film transistors including a semiconductor layer deposited on a substrate;
a plurality of light emitting diodes mounted respectively on the plurality of driving thin film transistors, for generating lights of different wavelengths;
a plurality of thin film sensors formed between the plurality of light emitting diodes and the substrate, for sensing the luminous intensities of the plurality of light emitting diodes; and
a luminance control circuit having a plurality of controlling thin film transistors including a semiconductor layer deposited on the substrate and being connected to the plurality of thin film sensors to control the driving thin film transistors,
wherein each of the plurality of driving thin film transistors and the controlling thin film transistors of the luminance control circuit includes a semiconductor layer, a gate electrode overlapping the semiconductor layer with an insulating layer disposed therebetween, and source and drain electrodes connected to two ends of the semiconductor layer, and
wherein the gate electrode of each of the plurality of driving thin film transistors is connected to the luminance control circuit, the source electrode is connected to one electrode of each of the light emitting diodes, and the drain electrode is connected to a driving voltage supply line for supplying a driving voltage from the exterior.

2. The light emitting diode substrate of claim 1, wherein the semiconductor layer and the plurality of thin film sensors are formed of any one of polysilicon, polysilicon-germanium, amorphous silicon, and amorphous silicon-germanium thin films.

3. The light emitting diode substrate of claim 2, wherein each of the plurality of thin film sensors is located under a through-hole penetrating one electrode of each of the light emitting diodes and is formed as a photodiode type having an anode and a cathode formed by injecting p-type and n-type impurities.

4. The light emitting diode substrate of claim 3, wherein one electrode of the anode and cathode of each of the plurality of thin film sensors is floating and the other electrode is connected through a current limiting resistor to a ground electrode, and wherein the ground electrode is connected to the other electrode of each of the light emitting diodes.

5. The light emitting diode substrate of claim 4, wherein the other electrode of each of the light emitting diodes is connected to the ground electrode through a bonding wire.

6. The light emitting diode substrate of claim 5, further comprising an organic insulating layer covering the substrate on which the plurality of light emitting diodes is mounted.

7. The light emitting diode substrate of claim 6, wherein the semiconductor layer, the gate electrode, the source electrode and the drain electrode of each of the plurality of driving thin film transistors are formed in a polygonal band or circular band shape encompassing peripheral parts of the thin film sensors.

8. The light emitting diode substrate of claim 7, wherein the plurality of light emitting diodes includes first to third light emitting diodes for respectively generating red, green and blue lights, the plurality of driving thin film transistors includes first to third driving thin film transistors for respectively driving the first to third light emitting diodes, and the plurality of thin film sensors includes first to third thin film sensors for respectively sensing the luminous intensities of the first to third light emitting diodes.

9. The light emitting diode substrate of claim 8, wherein the luminance control circuit includes:
   a first amplifier for controlling the third driving thin film transistor according to a luminance control signal;
   a first comparator for controlling the second driving thin film transistor by comparing a blue luminous sensing signal from the third thin film sensor with a green luminous sensing signal from the second thin film sensor; and
   a second comparator for controlling the first driving thin film transistor by comparing the blue luminous sensing signal with a red luminous sensing signal from the first thin film sensor.

10. The light emitting diode substrate according to claim 9, wherein the luminance control circuit further includes second to fourth amplifiers for amplifying the luminous sensing signals from the first to third thin film sensors, and at least one of the second to fourth amplifiers is controlled according to a relative luminance control signal.

11. A method of manufacturing a light emitting diode substrate, comprising:
   forming a plurality of driving thin film transistors including a semiconductor layer deposited on a substrate;
      mounting a plurality of light emitting diodes generating lights of different wavelengths on the plurality of driving thin film transistors;
   forming a plurality of thin film sensors sensing the luminous intensities of the plurality of light emitting diodes between the plurality of light emitting diodes and the substrate; and
   forming a luminance control circuit that has a plurality of controlling thin film transistors including a semiconductor layer deposited on the substrate and is connected to the plurality of thin film sensors and the plurality of driving thin film transistors,
   wherein each of the plurality of driving thin film transistors and the controlling thin film transistors of the luminance control circuit includes a semiconductor layer, a gate electrode overlapping the semiconductor layer with an insulating layer disposed there between, and source and drain electrodes connected to two ends of the semiconductor layer, and
   wherein the gate electrode of each of the plurality of driving thin film transistors is connected to the luminance control circuit, the source electrode is connected to one electrode of each of the light emitting diode, the drain electrode is connected to a driving voltage supply line for supplying a driving voltage from the exterior, and the other electrode of each of the light emitting diodes is connected to a ground electrode through a bonding wire.

12. The method of claim 11, wherein the semiconductor layer and the plurality of thin film sensors are formed of any one of polysilicon, polysilicon-germanium, amorphous silicon, and amorphous silicon-germanium thin films.

13. The method of claim 12, wherein p-type and n-type impurities are injected into both terminals of each of the plurality of thin film sensors to form an anode and a cathode, and wherein one electrode of the anode and cathode of each of the plurality of thin film sensors is floating and the other electrode is connected to the ground electrode through a current limiting resistor.

14. The method of claim 13, further comprising forming an organic insulating layer on the substrate on which the plurality of light emitting diodes is mounted.

15. The method of claim 14, wherein the semiconductor layer, the gate electrode, the source electrode and the drain electrode of each of the plurality of driving thin film transistors are formed in a polygonal band or circular band shape encompassing peripheral parts of the thin film sensors.

16. A liquid crystal display device, comprising:
   a light source including:
   a plurality of driving thin film transistors formed on a substrate,
   a plurality of light emitting diodes mourned respectively on the plurality of driving thin film transistors for generating lights of different wavelengths,
   a plurality of thin film sensors formed between the plurality of light emitting diodes and the substrate for sensing the luminous intensities of the plurality of light emitting diodes, and
   a luminance control circuit that has a plurality of controlling thin film transistors formed on the substrate and is connected to the plurality of thin film sensors and the plurality of driving thin film transistors; and
   a liquid crystal display panel for displaying an image by using light generated from the light source, and
   wherein each of the plurality of driving thin film transistors and the controlling thin film transistors of the luminance control circuit includes a semiconductor layer, a gate electrode overlapping the semiconductor layer with an insulating layer disposed therebetween, and source and drain electrodes connected to both ends of the semiconductor layer, and wherein the gate electrode of each of the plurality of driving thin film transistors is connected to the luminance control circuit, the source electrode is connected to one electrode of each of the light emitting diodes, and the drain electrode is connected to a driving voltage supply line for receiving a driving voltage.

17. The liquid crystal display device of claim 16, wherein the semiconductor layer and the plurality of thin film sensors are formed of any one of polysilicon, polysilicon-germanium, amorphous silicon, and amorphous silicon-germanium thin films, and wherein each of the plurality of thin film sensors is located under a through-hole penetrating one electrode of each of the light emitting diodes and is formed as a photodiode type having an anode and a cathode formed by injection of p-type and n-type impurities.

18. The liquid crystal display device of claim 17, wherein one electrode of the anode and cathode of each of the plurality of thin film sensors is floating and the other electrode is connected through a current limiting resistor to a ground electrode that is connected to the other electrode of each of the light emitting diodes, though a bonding wire.

19. The liquid crystal display device of claim 18, further comprising an organic insulating layer covering the substrate on which the plurality of light emitting diodes is mounted.

20. The liquid crystal display device of claim 19, wherein the plurality of light emitting diodes includes first to third light emitting diodes for respectively generating red, green and blue lights, the plurality of driving thin film transistors includes first to third driving thin film transistors for respectively driving the first to third light emitting diodes, and the plurality of thin film sensors includes first to third thin film sensors for respectively sensing the luminous intensities of the first to third light emitting diodes.

21. The liquid crystal display device of claim 20, wherein the luminance control circuit includes:
a first amplifier for controlling the third driving thin film transistor according to a luminance control signal;
a first comparator for controlling the second driving thin film transistor by comparing a blue luminous sensing signal from the third thin film sensor with a green luminous sensing signal from the second thin film sensor;
a second comparator for controlling the first driving thin film transistor by comparing the blue luminous sensing signal with a red luminous sensing signal from the first thin film sensor; and
second to fourth amplifiers for amplifying the luminous sensing signals from the first to third thin film sensors,
wherein at least one of the second to fourth amplifiers is controlled according to a relative luminance control signal.

* * * * *